(12) United States Patent
Zitouni et al.

(10) Patent No.: US 7,892,907 B2
(45) Date of Patent: Feb. 22, 2011

(54) CMOS LATCH-UP IMMUNITY

(75) Inventors: Moaniss Zitouni, Gilbert, AZ (US);
Patrice M. Parris, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 259 days.

(21) Appl. No.: 12/262,922

(22) Filed: Oct. 31, 2008

(65) Prior Publication Data

US 2010/0109090 A1 May 6, 2010

(51) Int. Cl.
*H01L 21/00* (2006.01)
(52) U.S. Cl. .................. 438/199; 438/197; 438/202
(58) Field of Classification Search .......... 438/197, 438/199, 202
See application file for complete search history.

(56) References Cited

U.S. PATENT DOCUMENTS

| | | | | |
|---|---|---|---|---|
| 5,406,513 | A * | 4/1995 | Canaris et al. | 365/181 |
| 5,438,005 | A * | 8/1995 | Jang | 438/220 |
| 6,392,282 | B1 * | 5/2002 | Sahara et al. | 257/438 |
| 6,420,221 | B1 * | 7/2002 | Lee et al. | 438/199 |
| 6,583,470 | B1 * | 6/2003 | Maki et al. | 257/349 |
| 6,614,078 | B2 * | 9/2003 | Lee et al. | 257/372 |
| 6,683,362 | B1 * | 1/2004 | O et al. | 257/471 |
| 6,787,858 | B2 * | 9/2004 | Zitouni et al. | 257/372 |
| 7,211,477 | B2 * | 5/2007 | de Fresart et al. | 438/197 |
| 7,276,768 | B2 * | 10/2007 | Furukawa et al. | 257/374 |
| 7,301,187 | B2 * | 11/2007 | Defresart et al. | 257/288 |
| 7,491,618 | B2 * | 2/2009 | Furukawa et al. | 438/361 |
| 7,645,676 | B2 * | 1/2010 | Furukawa et al. | 438/407 |

(Continued)

OTHER PUBLICATIONS

Hargrove, M. J., et al., Latchup in CMOS Technology, 07803-4400- IEEE Jun. 1998.
Liao, S., et al., New Observances and Analysis of Various Guard- Ring Structures on Latch-Up Hardness by Backside Photo Emission Image, 0-7803-7649 IEEE Aug. 2003.
Strachan, A., Substrate current injection and latchup in complementary Vertical Bipolar processes, IEEE BCTM, 2006.

(Continued)

*Primary Examiner*—Laura M Menz
(74) *Attorney, Agent, or Firm*—Ingrassia Fisher & Lorenz, P.C.

(57) ABSTRACT

Latch-up of CMOS devices (20, 20') is improved by using a structure (40, 40', 80) having electrically coupled but floating doped regions (64, 64'; 65, 65') between the N-channel (44) and P-channel (45) devices. The doped regions (64, 64'; 65, 65') desirably lie substantially parallel to the source-drain regions (422, 423; 432, 433) of the devices (44, 45) between the Pwell (42) and Nwell (43) regions in which the source-drain regions (422, 423; 432, 433) are located. A first ("N BAR") doped region (64, 64') forms a PN junction (512) with the Pwell (42), spaced apart from a source/drain region (423) in the Pwell (42), and a second ("P BAR") doped region (55, 55') forms a PN junction (513) with the Nwell (43), spaced apart from a source/drain region (433) in the Nwell (43). A further NP junction (511) lies between the N BAR (64) and P BAR (65) regions. The N BAR (64) and P BAR (65) regions are ohmically coupled, preferably by a low resistance metal conductor (62), and otherwise floating with respect to the device or circuit reference potentials (e.g., Vss, Vdd).

4 Claims, 4 Drawing Sheets

U.S. PATENT DOCUMENTS

| | | | |
|---|---|---|---|
| 7,655,985 B2 * | 2/2010 | Furukawa et al. | 257/372 |
| 7,700,996 B2 * | 4/2010 | Parris et al. | 257/324 |
| 7,727,848 B2 * | 6/2010 | Furukawa et al. | 438/361 |
| 7,791,145 B2 * | 9/2010 | Furukawa et al. | 257/374 |
| 2004/0075144 A1 * | 4/2004 | Zitouni et al. | 257/355 |
| 2006/0249751 A1 * | 11/2006 | de Fresart et al. | 257/197 |
| 2007/0120196 A1 * | 5/2007 | Chen et al. | 257/369 |
| 2007/0120198 A1 * | 5/2007 | Chen et al. | 257/372 |
| 2007/0122963 A1 * | 5/2007 | Chen et al. | 438/202 |
| 2007/0158777 A1 * | 7/2007 | de Fresart et al. | 257/492 |
| 2007/0158779 A1 * | 7/2007 | Cannon et al. | 257/500 |
| 2007/0170518 A1 * | 7/2007 | Furukawa et al. | 257/374 |
| 2007/0170543 A1 * | 7/2007 | Furukawa et al. | 257/520 |
| 2007/0194403 A1 * | 8/2007 | Cannon et al. | 257/506 |
| 2007/0241409 A1 * | 10/2007 | Furukawa et al. | 257/372 |
| 2008/0057671 A1 * | 3/2008 | Furukawa et al. | 438/426 |
| 2008/0203492 A1 * | 8/2008 | Cannon et al. | 257/374 |
| 2008/0217698 A1 * | 9/2008 | Furukawa et al. | 257/372 |
| 2008/0242016 A1 * | 10/2008 | Cannon et al. | 438/224 |
| 2008/0268610 A1 * | 10/2008 | Furukawa et al. | 438/430 |
| 2009/0127587 A1 * | 5/2009 | Parris et al. | 257/209 |
| 2010/0025761 A1 * | 2/2010 | Voldman | 257/338 |
| 2010/0109090 A1 * | 5/2010 | Zitouni et al. | 257/372 |

OTHER PUBLICATIONS

Niitsu, S., et al., Latchup free CMOS structure using shallow trench isolation, IEEE, IEDM, 1985.

Pavan, P., et al., Latch up Dc triggering and holding characteristics of NWELL, twin-tub and epitaxial CMOS technologies, IEE proceedings-G, vol. 138 No. 5, Oct. 1991.

Tremouilles, D., et al., Latch-up ring design guidelines to improve electrostatic discharge (ESD) protection scheme efficiency, IEEE Journal of solid state circuits, vol. 39, No. 10, Oct. 2004.

Wu, C., et al., Latchup failure path between Power pins in the mixed-voltage Process. IEEE, 2003.

Rubin, L., et al., Process architectures using Mev Implanted blanket buried layers for latch up Improvements on bulk silicon, IEEE, 1997.

Morris, W., et al., Buried layer/connecting layer high energy implantation for improved CMOS latch-up IEEE, 1997.

Morris, W., Latch-up in CMSO, 41st Annual international reliability physics symposium, Dallas, Texas, 2003.

* cited by examiner

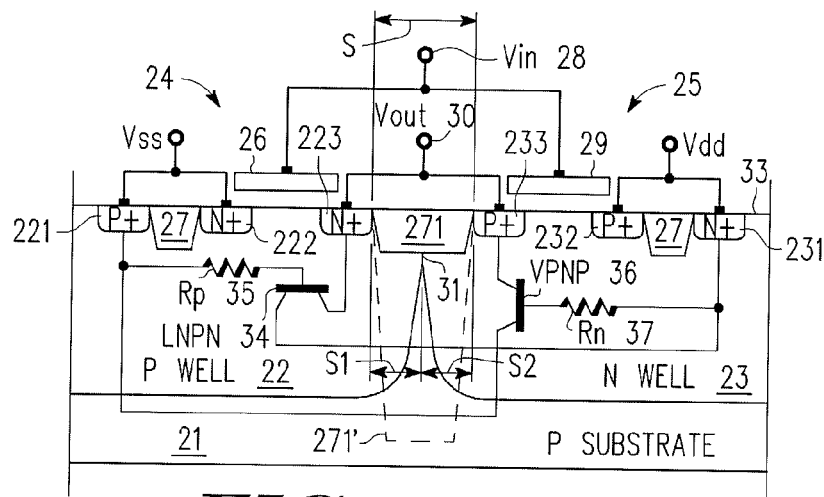
FIG. 1 -PRIOR ART-
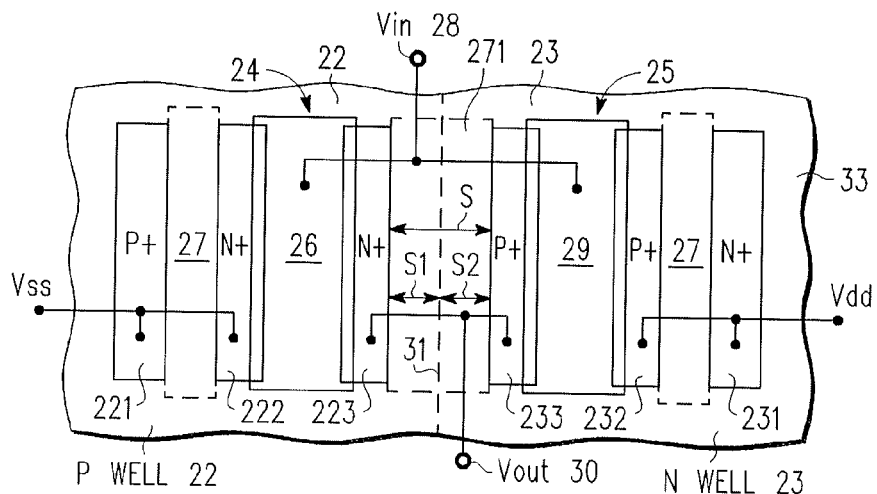
FIG. 2 -PRIOR ART-
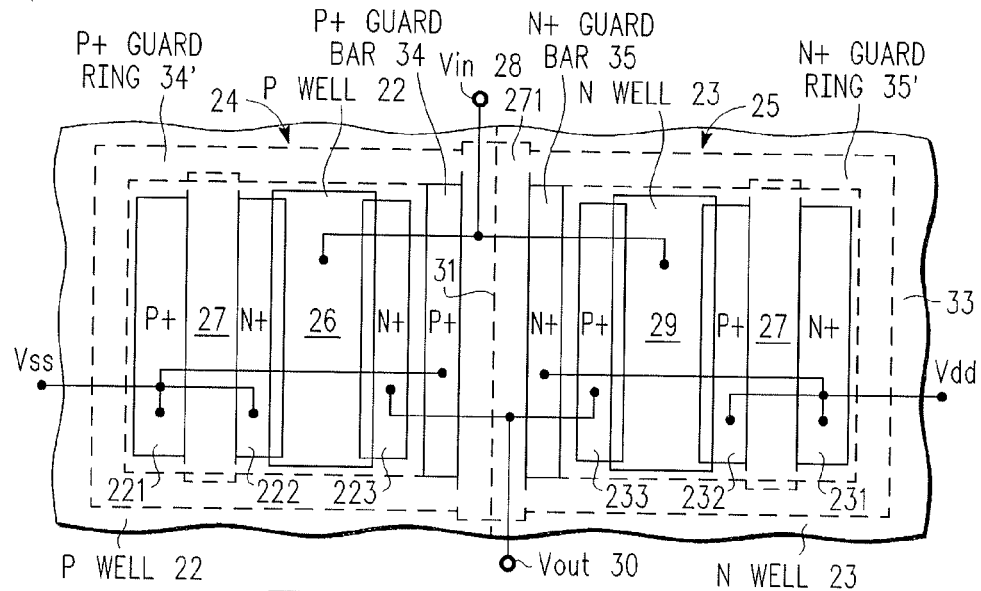
FIG. 3 -PRIOR ART-

CMOS LATCH-UP IMMUNITY

FIELD OF THE INVENTION

The present invention generally relates to semiconductor (SC) devices and integrated circuits (ICs) and, more particularly, structures and methods for improving the latch-up immunity of complementary metal-oxide semiconductor (CMOS) structures.

BACKGROUND OF THE INVENTION

Latch-up is the condition where parasitic devices inherent in many CMOS structures cause the CMOS structure to enter an electrical state unrelated to its normal operation. This is often manifested as an abnormal high current conduction state. The condition may be transient, it may disappear when the triggering stimulus is removed or it may be permanent in the sense that the structure becomes frozen in that state as long as power continues to be applied. It may revert to the same frozen state when power is reapplied. Unless the current in the latch-up state is somehow limited, it can also be destructive. Thus, latch-up is a condition to be avoided in CMOS devices and ICs, and latch-up immunity is a highly desired property.

It is well known that latch-up is an increasing problem with CMOS technologies as device and circuit dimensions are scaled down. A CMOS integrated circuit (IC) chip designer often faces the problem of how to optimize the structure in order to avoid latch-up. As device dimensions are reduced, the problem becomes more difficult since most of the prior art arrangements for improving latch-up immunity call for substantial increased device and/or circuit area. Thus, a need continues to exist for improved CMOS structures and methods wherein latch-up immunity is improved with minimum area penalty and without adverse effect on the other CMOS IC properties.

BRIEF DESCRIPTION OF THE DRAWINGS

The present invention will hereinafter be described in conjunction with the following drawing figures, wherein like numerals denote like elements, and wherein:

FIG. 1 is a simplified schematic cross-sectional view of a twin-well CMOS inverter, according to the prior art, showing the inherent parasitic bipolar devices present in such structures and a prior art arrangement for improving the latch-up immunity;

FIG. 2 is a simplified schematic plan view of the CMOS inverter of FIG. 1 according to the prior art;

FIG. 3 is a simplified schematic plan view of the CMOS inverter of FIG. 1 with guard rings or bars added according to the prior art;

DETAILED DESCRIPTION OF THE INVENTION

Figure 4:
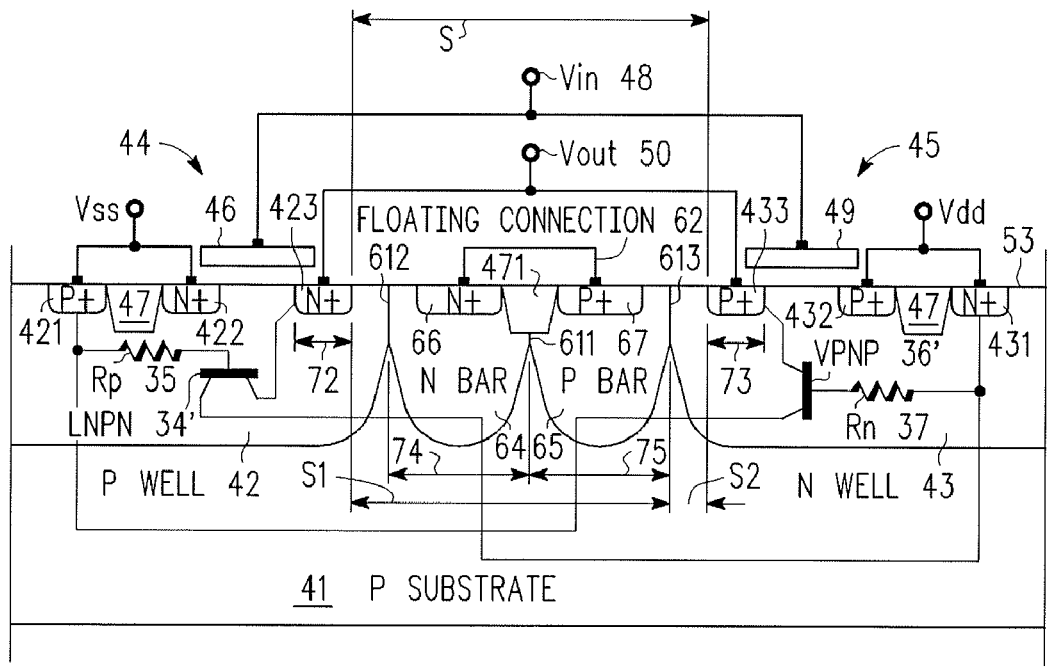
FIG. 4 is a simplified schematic cross-sectional view of a twin-well CMOS inverter, according to an embodiment of the present invention.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation or fabrication in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner.

The term "metal oxide semiconductor" and the abbreviation "MOS" and the term "complementary metal oxide semiconductor" and the abbreviation CMOS are intended to include any type of insulated gate field effect transistor (FET) or device, irrespective of whether the gate dielectric is formed from an oxide or another insulating material, and irrespective of whether the gate is formed from a metal or another type of conductor. Accordingly, these terms are used herein in this broader sense. The term "semiconductor" is intended to include any semiconductor whether single crystal, poly-crystalline or amorphous and including type IV semiconductors, non-type IV semiconductors, compound semiconductors as well as organic and inorganic semiconductors. Further, the terms "substrate" and "semiconductor substrate" are intended to include single crystal structures, polycrystalline and amorphous structures, thin film structures, layered structures as for example and not intended to be limiting semiconductor-on-insulator (SOI) structures, and combinations thereof. The term "semiconductor" is abbreviated as "SC."

For convenience of explanation and not intended to be limiting, semiconductor devices and methods of fabrication are described herein for silicon semiconductors but persons of skill in the art will understand that other semiconductor materials can also be used. Further, even though the present invention is illustrated for the case of a twin-well CMOS inverter, those of skill in the art will understand that the present invention applies to any type of CMOS device or other device having doped regions giving rise to parasitic transistors. Further, the various embodiments of the invention described herein are illustrated by semiconductor devices and structures of particular conductivity type having various P and N doped regions appropriate for that conductivity type device or structure. But this is merely for convenience of explanation and not intended to be limiting. Persons of skill in the art will understand that devices or structures of opposite conductivity type may be provided by interchanging conductivity types so that a P-type region becomes an N-type region, whereby for example, a P-channel structure can be provided in lieu of an N channel structure, and so forth. Alternatively, the particular regions illustrated in what follows may be more generally referred to as of a "first conductivity type" and a "second" opposite conductivity type", where the first conductivity type may be either N or P type and the second opposite conductivity type is then either P or N type, and so forth.

FIGS. 1-2 show prior art twin-well CMOS inverter 20 with N-channel device 24 located in Pwell 22 and P-channel device 25 located in Nwell 23 on substrate 21. P+ contact region 221 makes ohmic contact to Pwell 22 and N+ contact region 231 makes ohmic contact to Nwell 23. N+ source-drain regions 222, 223 of N-channel transistor 24 are provided in Pwell 22. P+ source-drain regions 232, 233 for P-channel transistor 25 are provided in Nwell 23. Either of regions 222, 223 and either of regions 232, 233 may serve as the source or drain. Gate 26 is provided for N-channel device 24 and gate 29 is provided for P-channel device 25. Gates 26, 29 extend between source-drain regions 222, 223 and 232, 233 in the conventional manner. When connected to form an inverter, gates 26, 29 are generally coupled together and signal input voltage (Vin) 28 is supplied thereto, and drain regions 233, 223 are generally coupled together and output voltage (Vout) 30 is obtained therefrom. Shallow trench isolation regions 27 are conventionally provided between device regions 221, 222 and between device regions 231, 232 at surface 33. Further, shallow trench isolation region 271 is generally provided between Pwell region 22 and Nwell region 23 at surface 33 where PN junction 31 formed therebetween would otherwise meet surface 33.

Parasitic bipolar transistors 34, 36 that can give rise to latch-up conditions are illustrated in FIG. 1. Bipolar transistor 34 is a lateral NPN transistor (abbreviated as LNPN) formed by N+ contact regions 223 and Nwell 23 with N+ contact region 231 serving as emitter and collector (or vice-versa) and Pwell 22 with P+ contact region 221 serving as the base of LNPN transistor 34. Base resistance Rp 35 of LNPN transistor 34 exists by virtue of the finite resistance of Pwell 22. Bipolar transistor 36 is a vertical PNP transistor (abbreviated as VPNP) formed by P+ contact regions 233 and P substrate 21 with Pwell 22 and P+ contact 221 serving as emitter and collector (or vice-versa) and Nwell 23 with N+ contact region 231 serving as the base of VPNP transistor 36. Base resistance Rn 37 of VPNP transistor 35 exists by virtue of the finite resistance of Nwell 23.

Latch-up can occur in several ways. For example, referring now to FIG. 1, when a positive voltage is applied to P+ contact region 233 in Nwell 23, it injects holes into substrate 21 through Nwell (base) 23 of VPNP bipolar transistor 36. The injected holes will be collected by P+ (collector) contact region 221 in Pwell 22. If the potential drop at Pwell 22 is enough to turn on N+/Pwell diode 223/22, N+ (emitter) 223 of LNPN transistor 34 is triggered and will start injecting electrons into substrate 21. The electrons are collected by Nwell 23 and N+ contact 231. If the potential drop in Nwell 23 is high enough, P+/Nwell diode 233/23 will be forced to inject more holes into substrate 21 which increases the current until latch-up occurs. This case is often referred to as "P latch."

When a negative voltage is applied to N+/Pwell diode 223/22 it starts injecting electrons into substrate 21 through Pwell (base) 22 of LNPN bipolar transistor 34. The injected electrons will be collected by Nwell (collector) region 23 and N+ contact 231. If the potential drop in Nwell 23 is enough to turn on P+/Nwell diode 233/23, emitter region 233 of VPNP transistor 36 is triggered and will start injecting holes into substrate 21 through Nwell 23. The holes are collected by Pwell region 22 and P+ contact 221. If the potential drop in Pwell 22 is high enough, N+/Pwell diode 223/22 will be forced to inject more electrons into substrate 21. This feedback loop increases the current until latch up occurs. This case is often referred to as "N latch".

The latch-up immunity or propensity depends upon a number of factors such as the doping level of well regions 22, 23 and spacing S between the injecting contacts, e.g., between regions 223, 233 of FIG. 1 and distances S1, S2 of these regions to the well boundaries (S=S1+S2). Prior art approaches to improving latch-up immunity include: (i) providing a deep dielectric filled trench isolation region, as for example, deep isolation trench 271', between N-channel and P-channel sides of the CMOS device, (ii) adding a buried layer beneath wells 22, 23, increasing spacing S between injecting contact regions 223, 233, (iii) adding guard rings around devices 24, 25 and (iv) increasing S. In many technologies, providing a deep isolation region, such as isolation region or trench 271', between the N-channel and P-channel portions of the CMOS device, or providing one or more buried layers beneath the N and P wells, is impractical, thereby limiting potential latch-up solutions to those approaches, including guard rings, that require an increase in the device spacing S.

FIG. 3 is a simplified schematic top view of CMOS device 20' incorporating P+ regions 34, 34' between or surrounding N-channel device 24 and N+ regions 35, 35' between or surrounding P-channel device 25, according to the prior art. Regions 34, 34'; 35, 35' may have the shape of guard rings encircling devices 24 25 or may be limited to lateral "bars" lying between devices 24, 25. For example, when the "bar" configuration is used, P+ guard BAR 34 and N+ guard BAR 35 lie between device 24 and device 25, and when the guard ring configuration is used, P+ guard BAR 34 becomes part of P+ guard ring 34' surrounding device 24 and N+ guard BAR 35 becomes part of N+ guard ring 35' surrounding device 25. In the prior art, regions 34, 34'; 35, 35' are biased by connecting them to predetermined potentials, as for example, connecting P+ region 34, 34' to the reference potential (e.g., Vss) and connecting N+ region 35, 35' to the primary circuit supply (e.g., Vdd). Injected electrons and holes are collected by these guard rings or bars, thereby reducing the bias change at the non-injecting emitters and increasing the trigger current for the onset of latch-up. This improves the latch-up immunity but at the expense of increased circuit lay-out area and/or interconnection complexity. The more the CMOS device lay-outs are desired to be shrunk to improve device packing and IC complexity, the more difficult it becomes to accommodate the area penalty and/or connection complexity required by such prior art guard rings or bars.

Figure 5:
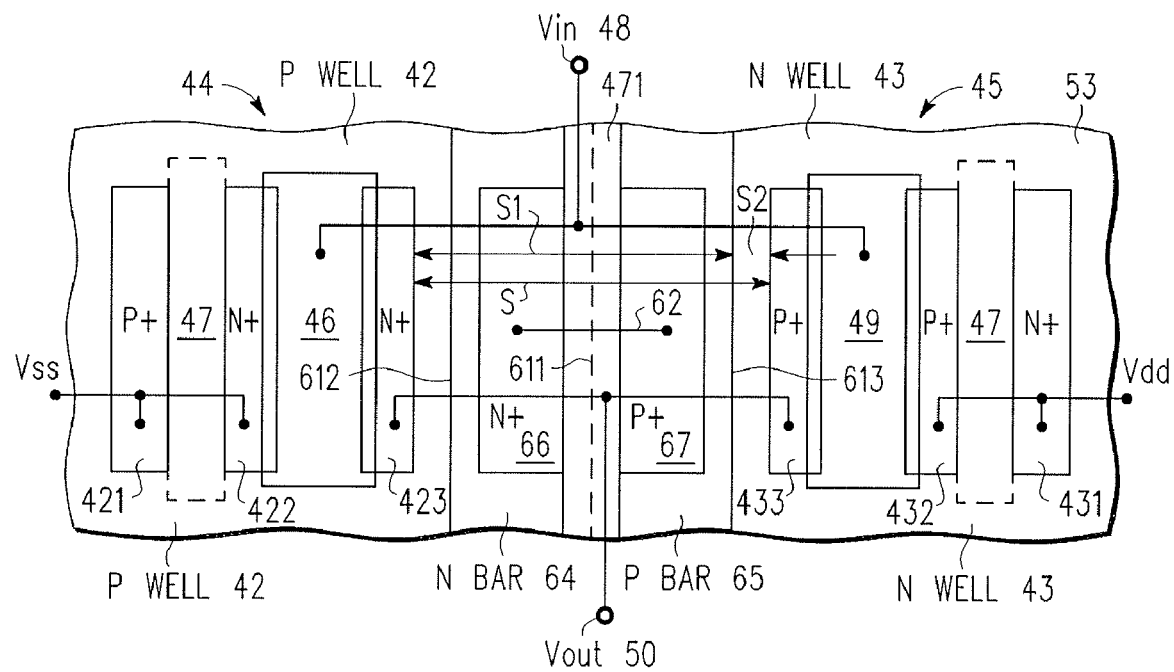
FIG. 5 is a simplified schematic plan view of the CMOS inverter of FIG. 4.

FIG. 4 is a simplified schematic cross-sectional view and FIG. 5 is a simplified schematic plan view of twin-well CMOS inverter 40, according to an embodiment of the present invention, for obtaining improved latch-up immunity. Inverter 40 comprises the following regions generally analogous to equivalent regions in the device of FIG. 1, for example, substrate 41, Pwell 42, Nwell 43, Pwell contact region 421, Nwell contact region 431, N+ source-drain (or drain-source) regions 422, 423 in Pwell 22, P+ source-drain (or drain-source) regions 432, 433 in Nwell 23, gate 46 for N-channel device 44 and gate 49 for P-channel device 45. As with the example of FIG. 1, gates 46, 49 are usually coupled together and to input terminal (e.g., Vin) 48, and drain regions 423, 433 are usually coupled together and to output terminal (e.g., Vout) 50. Contact regions 421, 422 are generally tied to Vss and contact regions 431, 432 are generally tied to Vdd, but these connections as well as the input-output connections are intended to be merely illustrative and not limiting. Shallow isolation trenches 47 and 471 are desirably provided between various device regions in much the same manner as in connection with FIG. 1.

Device 40 differs from device 20 of the prior art, by inclusion of additional N and P well regions 64, 65, referred to herein by the label "BAR" as for example, N BAR region 64 of width 74 and P BAR region 65 of width 75. N and P BAR regions 64, 65 are located between Pwell 42 and Nwell 43. For economy of processing, N BAR region 64 was formed at the same time using the same doping procedure (e.g., ion implantation) used for forming Nwell 43 and therefore has substantially the same depth and doping profile, and P BAR region 65 was formed at the same time and using the same procedure (e.g., also ion implantation) used for forming Pwell 42 and therefore has substantially the same depth and doping profile, but other procedures, separate masking steps and different doping profiles can also be used. Pwell and P BAR surface doping was between about 5E16 cm$^{-3}$ and 5E17 cm$^{-3}$ and Nwell and N BAR surface doping was between 7E16 cm$^{-3}$ and 7E17 cm$^{-3}$, but higher or lower doping values can also be used. N BAR region 64 conveniently forms PN junction 612 with Pwell 42 and P BAR region 65 conveniently forms PN junction 613 with Nwell 43. In the illustrated embodiment, NP junction 611 is conveniently formed between N BAR region 64 and P BAR region 65. This is the preferred arrangement. However, in other embodiments, one or more portions of substrate 41 may exist between one or more of Pwell 42, N BAR 64, N Bar 65 and/or Nwell 43. Shallow trench isolation region 471 is desirably provided at surface 53 where NP junction 611 between N BAR region 64 and P BAR region 65 would otherwise intersect surface 53. This is preferred, but may be omitted in other embodiments. N+ contact region 66 is conveniently provided to N BAR region 64 and P+ contact region 67 is conveniently provided to P BAR region 65.

It has been found that rather than coupling N and P BAR regions 64, 65 to various fixed potentials (e.g., one or the other of Vss or Vdd as with prior art bars or guard rings 34, 34'; 35, 35'), that significantly improved latch-up immunity is obtained by coupling N BAR region 64 and P BAR region 65 together via floating connection 62, which is conveniently provided between contact regions 66, 67. In the preferred embodiment, connection 62 is a low resistance metal connection, but in other embodiments, doped semiconductors, semi-metals and various electrically conductive alloys and/or mixtures may also be used. It has been found to be advantageous to have connection 62 floating with respect to Vss or Vdd or other fixed circuit potentials, that is, connection 62 need only run between N BAR region 64 and P BAR region 65 and need not be coupled to a reference potential generated elsewhere in the device or the circuit of which device 40 forms a part. This simplifies the necessary interconnections.

It will be noted in connection with FIGS. 4-5, that N BAR 64 adjacent Pwell 42 and P BAR 65 adjacent Nwell 43 lying between N-channel device 44 and P-channel device 45 have the opposite conductivity type as compared to guard ring or bar 34, 34' of N-channel device 24 and guard ring or bar 35, 35' of P-channel device 25 lying between N-channel device 24 and P-channel device 25 of the prior art. For example, in the prior art arrangement of FIG. 3 the order of regions from left to right is: first N-channel device 24, then P+ BAR 34, then N+ BAR 35 and lastly P-channel device 25. By comparison, the order of regions from left to right in FIGS. 4-5 is first N-channel device 42, then N BAR 64, then P BAR 65 and finally P-channel device 45. Thus, in the prior art, guard P+ BAR 34 is of the same conductivity type as Pwell 22 of device 24 and N+ BAR 35 has the same conductivity type as Nwell 23 of device 25, whereas in the invented embodiment of FIGS. 4-6, N BAR 64 and P BAR 65 have the opposite conductivity type as the wells of the device regions to which they are adjacent. It will be further noted in the embodiment illustrated in FIGS. 4-5, that N and P BARS 64, 65 are only provided between devices 44, 45 and that further bars laying laterally outside (e.g., to the left and right) of devices 44, 45 are not required, although as explained in connection with FIG. 6, additional bars may be included in further embodiments.

Figure 6:
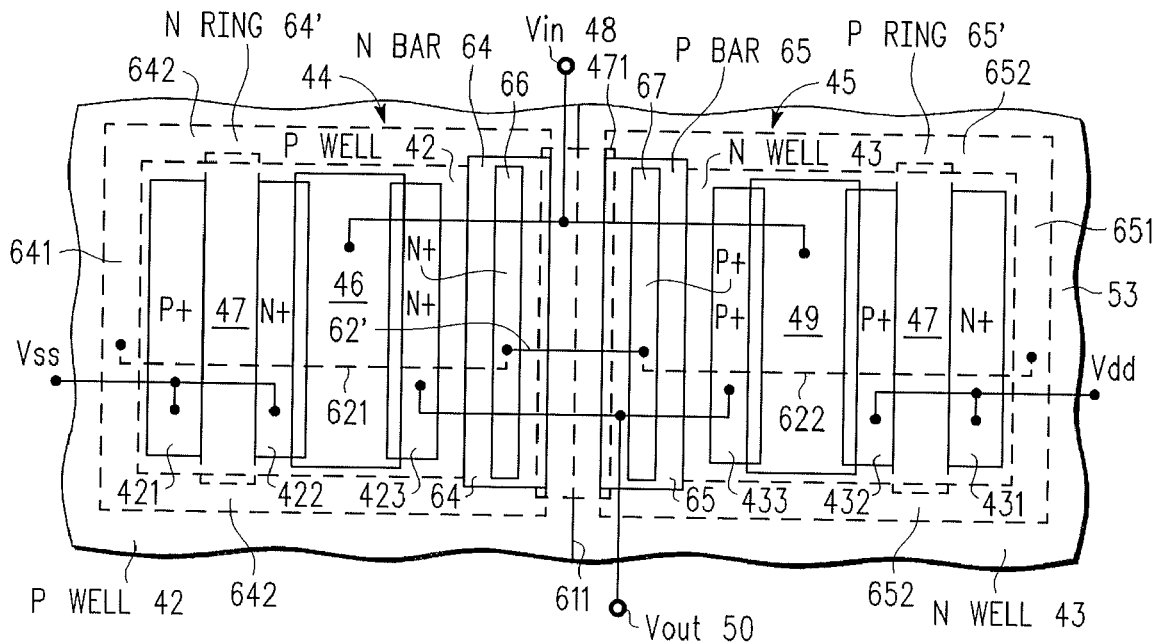
FIG. 6 is a simplified schematic plan view of a CMOS inverter analogous to that of FIG. 4 but according to a still further embodiment of the present invention wherein floating guard rings are provided.

FIG. 6 is a simplified schematic plan view of CMOS inverter 40' analogous to that of FIG. 4 but according to a still further embodiment of the present invention wherein floating lateral bars or guard rings 64, 64'; 65, 65' are provided for obtaining improved latch-up immunity. Each guard ring 64', 65' laterally surrounds its respective device, that is, N guard ring 64' laterally surrounds N-channel device 44 and P guard ring 65' laterally surrounds P-channel device 45. In other embodiments, segments 641 or 651 of guard rings 64', 65' or both may be provided outboard of devices 44, 45. These may be in lieu of or addition to BARS 64, 65. Unlike guard rings or bars 34, 34'; 35, 35' of the prior art (see FIG. 3) BARS or guard rings 64, 64'; 65, 65' and/or segments 641, 651 are tied together and desirably left floating with respect to the various fixed circuit potentials, e.g., Vss, Vdd, etc., in much the same manner as for N BAR region 64 and P BAR region 65 of FIGS. 4-5. For example, if only BARS 64, 65 are provided then they are conveniently coupled via conductor 62. If only rings 64', 65' are provided then they are also conveniently coupled via conductor 62. If BARS 64, 65 and ring segments 641, 651 are provided without intervening portions 642, 652 of rings 64', 65', then conductors 621, 622 are used to couple laterally separated portions 641, 642 together and to BARS 64, 65. Either arrangement is useful.

Table I below shows the latch-up trigger current $I_{trig}$ for various device configurations comparing the prior art structures illustrated in FIGS. 1-2 with the embodiments of the invented structures illustrated in FIGS. 5-6. The higher the latch-up trigger current $I_{trig}$, the greater the latch-up immunity. Thus, higher values of $I_{trig}$ are desirable.

TABLE I

Latch-up Trigger Current $I_{trig}$ for various device configurations

| Structural Configuration (S = S1 + S2) | S (micro-meters) | S1 (micro-meters) | S2 (micro-meters) | $I_{trig}$ (milli-amps) |
|---|---|---|---|---|
| FIGS. 1-2 PRIOR ART with S = minimum spacing | 2.0 | 1.4 | 0.6 | 0.7 |
| FIGS. 1-2 PRIOR ART with S = wider spacing | 30.0 | 29.4 | 0.6 | 4.1 |
| FIG. 3 PRIOR ART with wider spacing and P+ bar 34 at Vss and N+ bar 35 at Vdd | 30.0 | 29.4 | 0.6 | 11 |
| FIGS. 4-5 invented embodiment; wider spacing; N & P bars 64, 65 coupled and floating | 30.0 | 29.4 | 0.6 | 41.2 |

Table I above shows by way of example how inclusion of floating bars 64, 65 in the embodiment of FIGS. 4-5 increases the immunity to latch-up (i.e., provides higher $I_{trig}$) compared to the prior art arrangements of FIGS. 1-3. Parasitic bipolar transistors LNPN 34 and VPNP 36 illustrated in FIG. 1 also exist in the structure of FIG. 4 and are shown therein identified as LNPN 34' and VPNP 36'. Consider, for example, the operation of device 40 of FIGS. 4-5. When N+/Pwell contact (e.g. drain) region 423 comprising the emitter of parasitic LNPN transistor 34' is turned ON, electrons are injected therefrom toward substrate 41. But N BAR 54 collects such electrons and creates a negative potential underneath P bar 65. This negative potential helps to slow the injection from N+/Pwell contact region 423 and reduces the amount of electrons that would otherwise reach the collector (e.g., Nwell 43) of LNPN transistor 34 that also can act as base of VPNP transistor 36. When VNPN transistor 36' starts to conduct, analogous operation occurs because of the presence of P BAR region 65. As a consequence, the trigger current for the onset of latch-up is increased and the latch-up immunity improved for both P-Latch and N-Latch.

Figure 7:
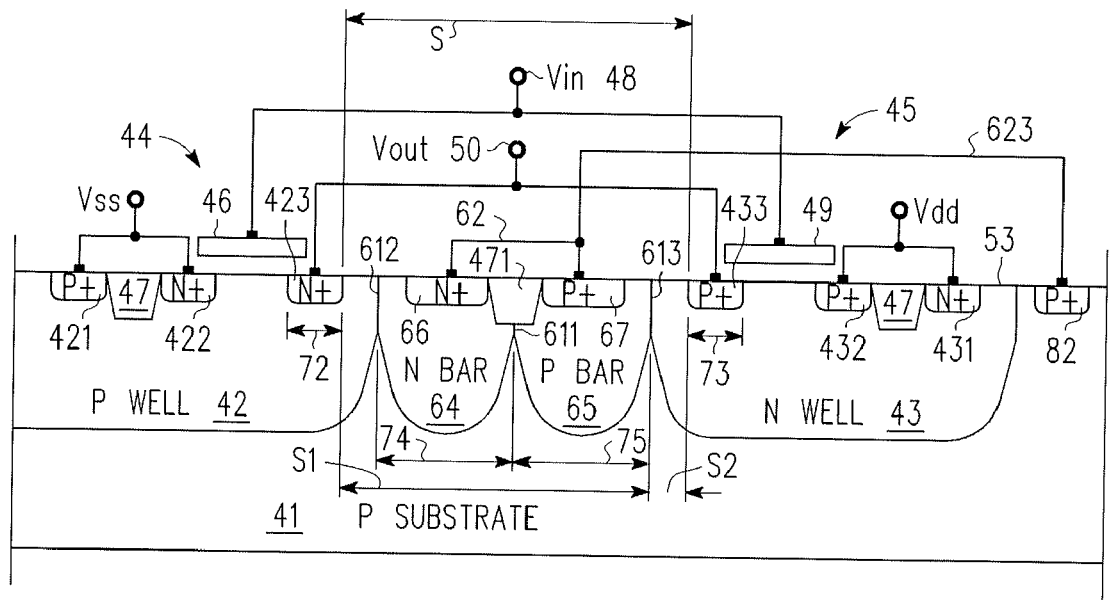
FIG. 7 is a simplified schematic cross-sectional view of a twin-well CMOS inverter, according to a yet further embodiment of the present invention.

FIG. 7 is a simplified schematic cross-sectional view of twin-well CMOS inverter device 80, according to a yet further embodiment of the present invention. Device 80 differs from device 40 by inclusion of P+ BAR 82 contacting substrate 41 laterally outside (to the right) of device 45. P+ BAR 82 is coupled to P BAR 65 and N BAR 64 as shown, for example, by connection 623. It has been found that this can further increase $I_{trig}$ and thereby the latch-up immunity.

Figure 8:
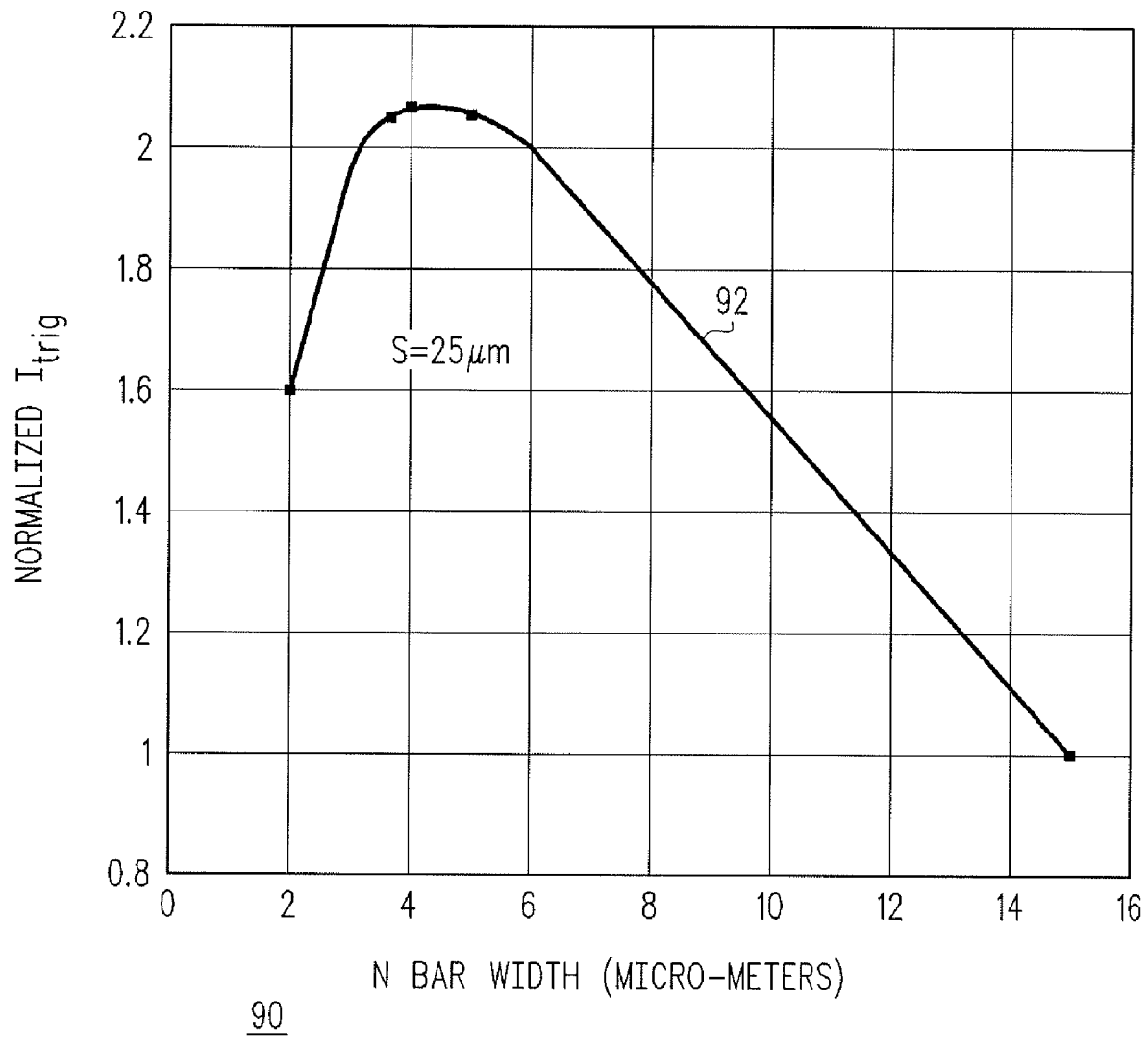
FIG. 8 is a plot of normalized latch-up trigger current as a function of the width of a floating guard bar placed between the CMOS devices of FIG. 4.

In obtaining the data of Table I concerning the embodiments illustrated in FIGS. 4-5, width 72 of contact region 423 was conveniently about 2 micro-meters. The widths of contact regions 422, 421 and 433, 432 and 431 were generally similar. For the data of Table I for S=30 micro-meters, width 75 of P BAR 65 was about 10 micro-meters and width 74 of N BAR 64 was about 10 micro-meters, but larger and smaller values can also be used. It was found that better performance (i.e., higher $I_{trig}$) can be obtained if width 74 of N BAR 64 and width 75 of P BAR 65 are unequal, that is, if width 74 of N BAR 64 is less width 75 of P BAR 65 or conversely that width 75 of P BAR 65 is larger than width 74 of N BAR 64. Stated more generally, it is useful that the ratio R of width 75 of P BAR 65 to width 74 of N BAR 64 be equal or greater than 1, more conveniently that the ratio R be in the range of about $2 \leq R \leq 5$, and preferably in the range of about $3 \leq R \leq 4$. In the ranges noted herein for R, for constant S and a given width 75 of P BAR 65, there is generally an optimum width for N BAR 64 or vice versa. FIG. 8 shows plot 90 of trace 92 of latch-up trigger current $I_{trig}$ as a function of width 74 of N BAR 64 for constant S=25 micro-meters, normalized to the value for width 74 of N BAR 64 of about 15 micro-meters. It will be noted that $I_{trig}$ has a maximum at width 74 of N BAR 64 of about 4 micro-meters, wherein width 75 of P BAR 65 was about 16 micro-meters (e.g., R~4).

According to another embodiment, the above described devices 40, 40', 80 are conveniently formed by a method comprising:

providing substrate 41 and then in any order:

forming first well region 42 of a first conductivity type in substrate 41;

forming second well region 43 of a second, opposite, conductivity type, in substrate 41 laterally separated from first well region 42;

forming first further region 65 of the first conductivity type in substrate 41 between first 42 and second 43 well regions, proximate second well region 43;

forming second further region 64 of the second conductivity type in substrate 41 between first 42 and second 43 well regions, proximate first well region 42;

providing first source-drain regions 432, 433 of the first conductivity type in second well region 43;

providing first contact region 421 of the first conductivity type in first well region 42;

providing second contact region 67 of the first conductivity type in first further region 65;

providing second source-drain regions 422, 423 of the second conductivity type in first well region 42;

providing third contact region 431 of the second conductivity type in second well region 43;

providing fourth contact region 66 of the second conductivity type in second further region 64; and then ohmically coupling second and fourth contact regions 67, 66.

It is desirable that first well region 42 and the first further region 65 are formed at substantially the same time. It is further desirable that second well region 43 and second further region 64 are formed at substantially the same time. It will be understood that since the first source-drain regions 432, 433, the first contact region 421 and the second contact region 67 are of the same (e.g., first) conductivity type, they can be provided individually or at the same time in various combinations. Similarly, it will be understood that since the second source-drain regions 422, 423, the third contact region 431 and the fourth contact region 66 are of the same (e.g., second) conductivity type, they can be provided individually or at the same time in various combinations. Ion implantation is a suitable doping method for forming such regions. In a preferred embodiment, first further region 65 has first width 75 and second further region 64 has second width 74 and first width 75 exceeds second width 74. In a further embodiment, still further contact region 82 of the first conductivity type is formed in substrate 41 laterally outside second well region 43 and still further contact region 82 is ohmically coupled to one or both of first 65 and second 64 further regions.

According to a first embodiment, there is provided a CMOS device structure (40, 40', 80), comprising, a first MOS transistor (44) having first source and drain regions (422, 423) of a first conductivity type located in a first semiconductor region (42) of a second, opposite conductivity type, a second MOS transistor (45) coupled to the first MOS transistor (44) and having second source and drain regions (432, 433) of the second conductivity type located in a second semiconductor region (43) of the first conductivity type, a first further semiconductor region (64, 64') of the first conductivity type proximate the first semiconductor region (42) and located between the first MOS transistor (44) and the second MOS transistor (45), a second further semiconductor region (65, 65') of the second conductivity type proximate the second semiconductor region (43) and located between the first MOS transistor (44) and the second MOS transistor (45), and wherein the first and second further regions (64, 65, 64', 65') have an ohmic connection (62) therebetween. According to a further embodiment, the ohmic connection is electrically floating with respect to reference potential terminals adapted to be coupled to the first and second source-drain regions (422, 423; 432, 433) of the CMOS device structure (40, 40', 80). According to a still further embodiment, the first further semiconductor region (64, 64') is formed at the same time as the second semiconductor region (43) and the second further semiconductor region (65, 65') is formed at the same time as the first semiconductor region (42). According to a yet further embodiment, the first further semiconductor region (64, 64') has a first width (74) and the second further semiconductor region (65, 65') has a second width (75) equal or larger than the first width (74). According to a still yet further embodiment, the second width (75) is in the range of about 2 to 5 times greater than the first width (74). According to a yet still further embodiment, the second semiconductor region (43) has a second depth and the first further semiconductor region (64, 64') has substantially the same second depth. According to another embodiment, the first (64, 64') and second (65, 65') further semiconductor regions have substantially rectangular plan view shapes. According to a still another embodiment, the device structure (40, 40', 80) comprises a still further region (82) of the second conductivity type located laterally outboard of the second semiconductor region (43) of the second transistor (45) and ohmically coupled to one or both of the first and second further semiconductor regions (64, 64'; 65, 65'). According to a yet further embodiment, the first further semiconductor region (64') has a ring shape, substantially surrounding the first MOS transistor (44). According to a still yet another embodiment, the first further semiconductor region comprises two BAR portions (64, 641), a first BAR portion (64) located between the first MOS transistor (44) and the second MOS transistor (45) and a second bar portion (641) spaced apart from and substantially parallel to the first BAR portion (64) and adjacent the first CMOS transistor (44) in a location remote from the second CMOS transistor (45). According to a yet still another embodiment, the first MOS transistor (44), the first further semiconductor region (64, 64'), the second further semiconductor region (65, 65'), and the second MOS transistor (45) are laterally arranged in that order.

According to a second embodiment, there is provided an electronic device (40, 40', 80) having first (44) and second (45) field effect transistors of opposite conductivity type, comprising, a first region (42) of a first conductivity type having therein source-drain regions (422, 423) of a second conductivity type opposite the first conductivity type, thereby forming the first (44) field effect transistor, a second region (43) of the second conductivity type having therein source-drain regions (432, 433) of the first conductivity type, thereby forming the second (45) field effect transistor, and third (64, 64') and fourth (65, 65') ohmically coupled regions of, respectively, second and first conductivity types, located between the first region (42) and the second region (43). According to a further embodiment, the third (64, 64') region is proximate the first region (42). According to a still further embodiment, the electronic device (40, 40', 80) is adapted to receive a reference potential at a first terminal and a power supply potential at a second terminal and neither of the third (64, 64') and fourth (65, 65') regions is ohmically coupled to the first or second terminals. According to a yet further embodiment, the third (64) region has a third width (74) and the fourth (65) region has a fourth width (75) the fourth width (75) divided by the third width (74) forms a ratio R≧1. According to a still yet further embodiment, 2≦R≦5. According to a yet still further embodiment, the first (44) and second (45) field effect transistors are coupled so as to form an inverter.

According to a third embodiment, there is provided a method for forming a CMOS device (40, 40', 80), comprising, providing a substrate (41) and then in any order, forming in the substrate a first well region (42) of a first conductivity type, forming in the substrate a second well region (43) of a second, opposite, conductivity type, laterally separated from the first well region (42) by a first distance, forming a first further region (65) of the first conductivity type in the substrate (41) between the first (42) and second (43) well regions, proximate the second well region (43), forming a second further region (64) of the second conductivity type in the substrate (41) between the first (42) and second (43) well regions, proximate the first well region (42), providing first source-drain regions (432, 433) of the first conductivity type in the second well region (43); providing a first contact region (421) of the first conductivity type in the first well region (42); providing and a second contact region (67) of the first conductivity type in the first further region (65), providing second source-drain regions (422, 423) of the second conductivity type in the first well region (42); providing a third contact region (431) of the second conductivity type in the second well region (43), providing a fourth contact region (66) of the second conductivity type in the second further region (64), and then ohmically coupling the second (67) and fourth (66) contact regions. According to a further embodiment, the first well region (42) and the first further region (65) are formed at substantially a first same time, and the second well region (43) and the second further region (64) are formed at substantially a second same time. According to a yet further embodiment, the first further region (65) has a first width (75) and the second further region (64) has a second width (74) and the first width (75) equals or exceeds the second width (74). According to another embodiment, the method further comprises forming a still further contact region (82) of the first conductivity type in the substrate (41) laterally outside the second well region (43) and ohmically coupling the still further contact region (82) to one or both of the first (65) and second (64) further regions.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for forming a CMOS device, comprising:
providing a substrate and then in any order:
forming in the substrate a first well region of a first conductivity type;
forming in the substrate a second well region of a second, opposite, conductivity type, laterally separated from the first well region by a first distance;
forming a first further region of the first conductivity type in the substrate between the first and second well regions, proximate the second well region;
forming a second further region of the second conductivity type in the substrate between the first and second well regions, proximate the first well region;
providing first source-drain regions of the first conductivity type in the second well region;
providing a first contact region of the first conductivity type in the first well region;

providing a second contact region of the first conductivity type in the first further region;
providing second source-drain regions of the second conductivity type in the first well region;
providing a third contact region of the second conductivity type in the second well region;
providing a fourth contact region of the second conductivity type in the second further region; and then
ohmically coupling the second and fourth contact regions.

2. The method of claim 1, wherein the first well region and the first further region are formed at substantially a first same time, and the second well region and the second further region are formed at substantially a second same time.

3. The method of claim 1, wherein the first further region has a first width and the second further region has a second width and the first width equals or exceeds the second width.

4. The method of claim 1, further comprising, forming a still further contact region of the first conductivity type in the substrate laterally outside the second well region and ohmically coupling the still further contact region to one or both of the first and second further regions.

* * * * *